United States Patent [19]

Malm

[11] 4,338,633
[45] Jul. 6, 1982

[54] FRAME INTEGRATOR FOR CID IMAGING SYSTEM

[75] Inventor: Robert Malm, Pacific Palisades, Calif.

[73] Assignee: Northrop Corporation, Los Angeles, Calif.

[21] Appl. No.: 207,478

[22] Filed: Nov. 14, 1980

[51] Int. Cl.³ .............................................. H04N 5/30
[52] U.S. Cl. ...................................... 358/213; 357/30
[58] Field of Search ............................. 358/213, 166; 250/211 R, 211 J, 578; 357/24, 30

[56] References Cited

U.S. PATENT DOCUMENTS

| | | | |
|---|---|---|---|
| 4,032,976 | 6/1977 | Levine | 358/213 |
| 4,079,422 | 3/1978 | Anagnostopoulos | 358/213 |
| 4,117,514 | 9/1978 | Terui | 358/213 |
| 4,220,976 | 9/1980 | Koch | 358/213 |
| 4,274,113 | 6/1981 | Ohba | 358/213 |

OTHER PUBLICATIONS

Koch, "Charge-Injection Device with CCD Readout" IEEE Journal of Solid-State Circuits, vol. SC-14 No. 3, Jun. 1979, pp. 604-608.
Tseng et al., "Charge Transfer and Blooming Suppression of Charge Transfer Photodiode Area Array" IEEE Jour. of Solid State-Circuits, vol. SC-15, No. 2, Apr. 1980, pp. 206-213.

Primary Examiner—Michael A. Masinick
Attorney, Agent, or Firm—Edward A. Sokolski

[57] ABSTRACT

A frame integrator for integrating each of the outputs of an array of radiation detectors whose output is obtained by the charge-injection-device technique. An array of analog integrators is connected using row and column interconnection techniques with an array of radiation detectors. The output from each radiation detector is sampled periodically and the detector returned to its unexposed condition to avoid saturation of the detector. The analog integrator associated with each detector integrates the sampled output of the detector to increase the effective sensitivity of the detector and to reduce the noise in the output. Each analog integrator consists of a precharged capacitor which is discharged through a field effect transistor in an amount proportional to the output of the associated radiation detector.

3 Claims, 10 Drawing Figures

FRAME INTEGRATOR FOR CID IMAGING SYSTEM

BACKGROUND OF THE INVENTION

1. Field of the Invention

This invention pertains to semiconductor radiation detectors. More particularly, this invention pertains to the integration of the outputs from metal-insulator-semiconductor (MIS) radiation detectors used in an array as an imaging device in which the outputs of the individual detectors are obtained by the charge-injection device (CID) technique (see U.S. Pat. No. 4,079,422 and Burke and Michon, "Charge Injection Imaging: Operating Techniques and Performances Characteristics," *IEEE Journal of Solid-State Circuits*, pp. 121–128, vol. SC-11, No. 1, February 1976).

2. Description of the Prior Art

The charge injection device technique for reading out an image incident on an array of metal-insulator-semiconductor radiation detectors is known in the prior art; see Burke and Michon, id. Computational methods have been developed to process the output from an array of radiation detectors to compensate for differences between the individual detectors in their sensitivity to incident radiation and in their "zero signal" output in the absence of incident radiation (see U.S. Pat. No. 3,949,162; U.S. Pat. No. 3,800,079; and U.S. Pat. No. 3,800,078). Means have also been developed to automatically adjust the bias voltage on each element of an array of transistors which is used to read out detector arrays by the charge injection device technique, so as to compensate for differences in the threshold voltages among the various readout transistors (see U.S. Pat. No. 4,055,836 and U.S. Pat. No. 4,016,550).

In U.S. Pat. No. 4,079,422, Anagnostopoulos has described a technique for reducing certain distortions in the output of arrays of radiation detectors, which are read out by the charge injection device technique, that are caused by over illumination of some elements in the array. Anagnostopoulos recognized that the strong illumination of some elements in a column of detectors, in effect, altered the capacitance between the column conductor used for readout of the particular column of elements and, as a consequence, the strong illumination altered or distorted the voltage change in the column conductor produced by the readout of one element in the column. (See U.S. Pat. No. 4,079,422.) Anagnostopoulos connected an external, precharged capacitor to the column conductor and measured the voltage change across this external capacitor due to charge transfer in the detector element to measure the output of the particular radiation detector. By reducing the change in the column voltage to a small amount, the external capacitor reduced the effect of changes in capacitance in other elements in the column of the array on the output. Thus, Anagnostopoulos's technique compensates at least in part for the distorting effects of strong illumination of one or more detector elements in a column of an array upon the output of the other detector elements in the same column.

None of the compensation techniques described above, however, compensate for or reduce the distortion effects in each radiation detection element caused by the saturation of the detection mechanism within the same element.

In order to increase the output from each of the elements in an array of radiation detectors, and thus to reduce the noise associated with the output of each individual element (as contrasted with "array" noise associated with differences between the elements), the length of time to which the element is exposed to radiation before the output of the element is read can be increased, thus, in effect, integrating within the radiation detector, the intensity of the incident radiation. The integration of the incident radiation within the detector, however, is limited because the amount of charge that can be created by the incident radiation and collected within each element before the collected charge reaches a saturation level.

SUMMARY OF THE INVENTION

The present invention avoids the distortion caused by saturation of the detector elements by using a sufficiently short integration period within the detection element such that the output of the element does not saturate. At the end of the short period the output of the detector is "read out" and the detector element is reset to the unexposed state by dumping the charge created by the exposure to radiation. Successive outputs obtained from each element are integrated by integrating means external to the detection element to obtain an increased output signal with reduced noise, as if the integration had occurred within the detector element.

For a single detector element, such external integration could be effected by means of digital computations. However, for a large array of detectors, which use short exposure times between readouts to avoid saturation, the computational demand on a digital system for both the analog to digital transformation of each sample output and for the integration of the transformed outputs of each of the elements is excessive. The invention described here avoids such digital computational problems by using a separate, analog integrator for the output of each radiation detector. After a number of sampled outputs from each radiation detector has been integrated by its associated analog integrator, the outputs of the integrators are then processed digitally with relatively simple digital equipment at relatively slow, computational rates.

This invention utilizes row and column techniques to interconnect an array of analog integrators with a similar array of radiation detectors. Interconnection by means of rows and columns makes possible the association of each analog integrator, in a two-dimensional array, with its respective radiation detector in a similar, two-dimensional array without need for individual connections between each detector and its respective integrator. The use of row and column interconnection techniques avoids the practical difficulty of providing individual direct connections between each detector in a large array and its related integrator in a separate array.

This invention utilizes a precharged capacitor as an analog integrator. Each time the output of a detector element is read out, the detector output is used to control the discharge of current from the integrating capacitor through a field-effect transistor (FET) that is connected across the capacitor.

DESCRIPTION OF THE PREFERRED EMBODIMENT

Figure 1:
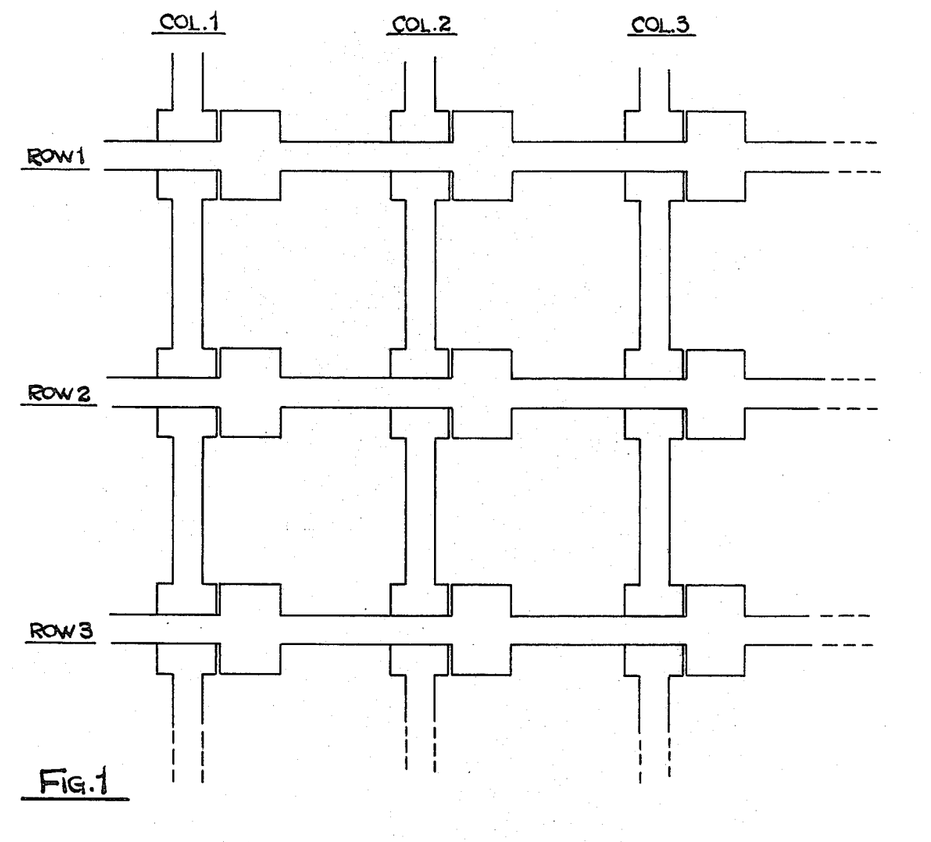
FIG. 1 is an illustration of the row and column interconnections between the conductive elements that form the readout elements in a charge-injection-device for the readout of an array of radiation detectors.
Figure 2A:
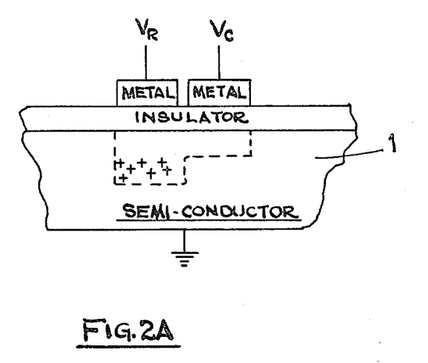
FIGS. 2A through 2C illustrate the manner in which charge is collected and transferred within each element of the detector.
Figure 2B:
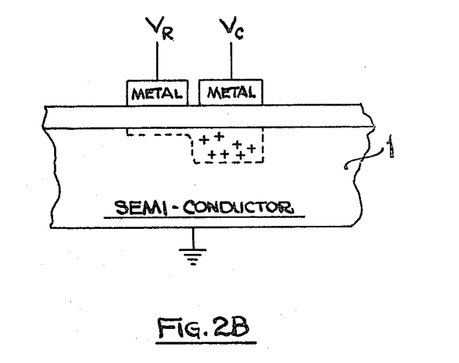
Figure 2C:
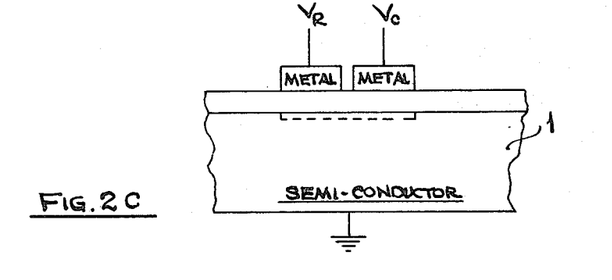

The structure used for the readout of an array of radiation detectors by means of the charge-injection-device technique consists of a square or rectangular array of pairs of transparent metal electrodes deposited on a thin insulating layer of an appropriate semiconductor material. As shown in FIG. 1, half of the electrodes (one of each pair) are connected together in rows and the other half of the electrodes are connected in columns.

Figure 3:
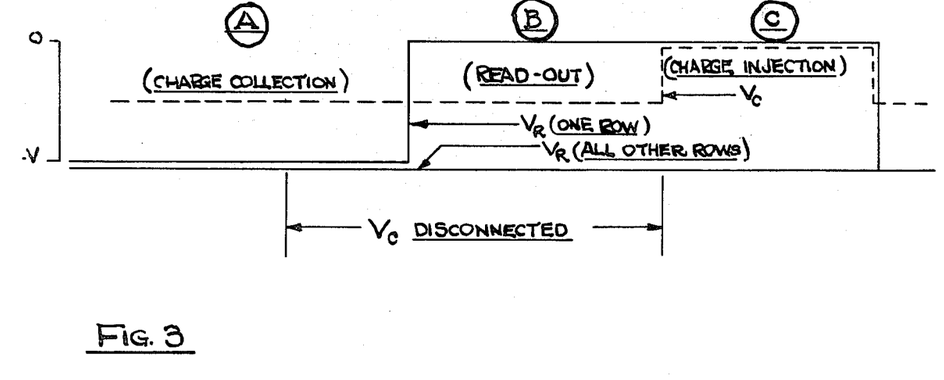
FIG. 3 is a graph showing the manner in which the voltages applied to the rows and columns at the CID vary with time.

Referring now to FIGS. 2A, 2B, 2C and FIG. 3, photons incident on the array during the charge-collection period Ⓐ generate hole-electron pairs. As shown in FIG. 3, at the beginning of the charge-collection period, $V_C$, the column voltage in each column is held at $-V/2$ volts, and $V_R$, the row voltage for each row, is held at $-V$ volts, where V is typically $-8$ volts. As a consequence of these voltages, the elecrons generated by the incident radiation are swept away from the electrodes to the ground. Because the row conductor voltages $V_R$ are more negative than the column conductor voltages $V_C$, the holes migrate to the regions beneath the row electrodes. Near the end of the charge-collection period, the column electrodes are floated, i.e., each of the column conductors is disconnected from the source of $-V/2$ volts. The voltage $V_R$ for the particular row, which is to be "read-out", is changed from $-V$ volts to zero. The voltages of the other row conductors are kept at $-V$ volts. The change of the selected row voltage from $-V$ to zero, which occurs at the beginning of interval Ⓑ, forces the charges previously collected under the selected row electrodes to migrate to the vicinity of the column electrodes. Because the column electrodes are floating, the voltage on each column conductor changes in proportion to the amount of charge that is shifted from under the one selected row of electrodes to the vicinity of the adjacent column electrodes. By measuring the change in column conductor voltage for each of the columns at the end of the readout interval, one obtains or "reads out" the output from each of the selected row of detectors. During the charge-injection period Ⓒ, the voltage $V_C$ is also made zero which causes the collected charge to be transferred or "dumped" to the substrate (shown in FIGS. 2A, 2B, and 2C as the "ground"), where it is neutralized. The voltages $V_R$ and $V_C$ are then returned to their original values and the next charge-collection period begins. The method described above, for reading out the input of the array of radiation detectors, is referred to herein as the "charge-injection-device technique".

The sensitivity of the detector array can be improved by lengthening the charge-collection interval, and thereby increasing the exposure time of the array to the incident photon flux. This procedure is productive up to a point, but eventually the detectors "saturate" and additional photon generation of hole-electron pairs does not lead to significant increases in the amount of charge collected beneath the row electrodes. As a consequence, in order to improve the signal-to-noise ratios of the individual detectors, it is necessary externally to integrate individually each of the outputs of the detectors over some period of time consistent with the overall system requirements.

In some applications, to avoid saturation, the charge collection time within the detector must be as short as 100–150 microseconds. If the integration of the individual outputs of each of the detectors were to be performed digitally, 6,000–10,000 analog-to-digital conversions per second would be required for each detector. It is apparent that for two-dimensional arrays of significant size (e.g. $32 \times 32$ to $128 \times 128$), digital integration of the outputs would require significant digital computation capacity.

Rather than perform the integration by digital means, this invention utilizes analog techniques. The basic building block of the array of integrators, referred to here as the Frame Integrator, is a metal-oxide-semiconductor-field-effect transistor (MOSFET) connected across a capacitor of typically 0.5 μfd precharged to an appropriate voltage, typically 10 volts. The gate of the MOSFET is connected to an input derived from an array column conductor. The MOSFET source is set at a voltage such that when the column conductor is floated, no current flows between the source and drain of the MOSFET. When the row-to-column charge transfer takes place, the change in the column voltage causes a small amount of current to flow through the MOSFET, thus partially discharging the capacitor. The capacitor is discharged in small steps during the frame integrating period with the result that the total decrease in voltage on the capacitor from its precharged value represents the sum of the squares of the column voltage changes induced by the row-to-column charge transfers. The change in the voltage on the capacitor is related to the sum of the squares of the column voltage changes because the MOSFET current is proportional to the square of its gate voltage change when the initial gate-source voltage is equal to the threshold voltage, which is the voltage at which current just begins to flow through the MOSFET.

As a consequence of the square law integration process in the frame integrator, a square root operation must be performed in connection with the subsequent array compensation computations. These compensations, however, can be performed digitally at a relatively slow data rate since they are performed on the output of the analog integrators rather than on the outputs of the detectors.

Figure 4A:
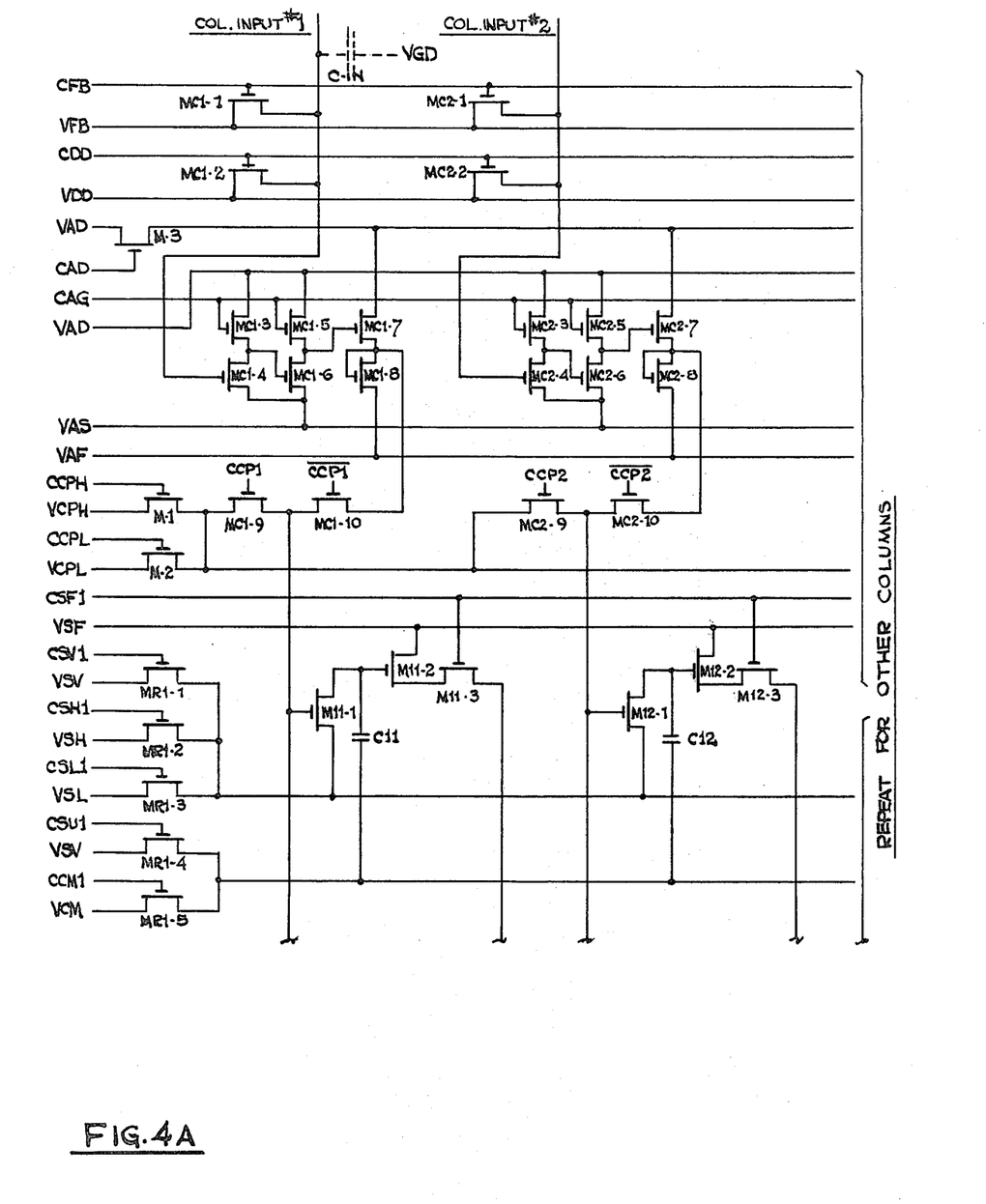
FIGS. 4A and 4B are a schematic diagram of the frame integrator circuit.
Figure 4B:
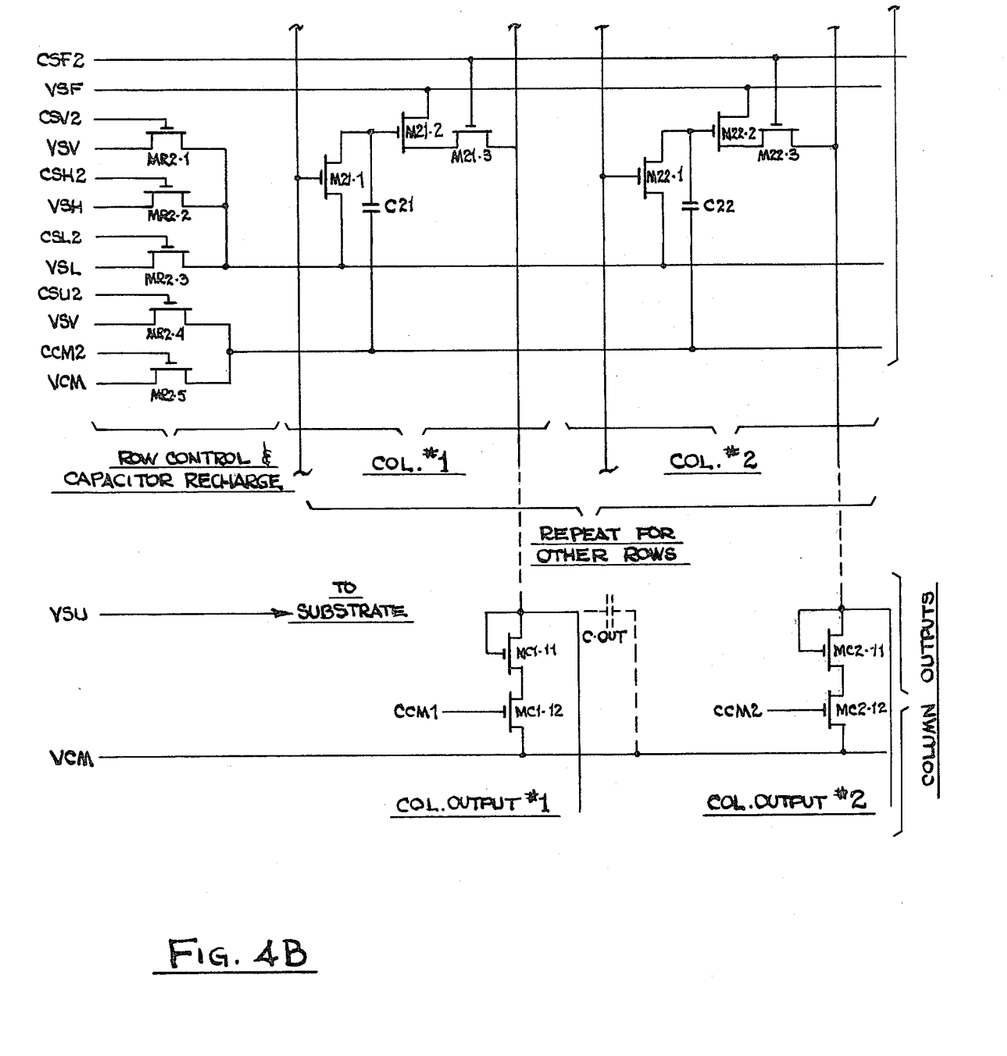

The voltage applied to the connecting conductors indicated in FIG. 4 and denoted at the left side of FIG. 4 as VFB, VDD, etc., which begin with the letter "V", are fixed voltages. The voltages, such as CFB and CDD, which begin with the letter "C", are control voltages which vary with time in the manner depicted in FIG. 5. FIG. 4 contains a circuit diagram of the frame integrator. The frame integrator is constructed of a number of field effect transistors and capacitors connected together by conductors in the manner indicated in FIG. 4. The transistors denoted as MC1-1 and MC1-2 act as switches to connect voltage sources to the conductor connecting the first column of radiation detectors. Transistors MC2-1 and MC2-2 perform a similar function with respect to the second column conductor. Similar circuitry is associated with each of the remaining column conductors in the detector array but which are not shown in FIG. 4.

Transistors denoted MC1-1 through MC1-8 act as switches and amplifier components for the voltage appearing on column conductor 1. Similarly, transistors MC2-3 through MC2-8 perform these functions for column 2. Similar circuitry, not shown in FIG. 4, is connected to the remaining column conductors.

Transistors MC1-9 and MC1-10 act as switches to connect the output of the column amplifier for column 1 to the inputs to the related column of integrators and to supply a "turn-on" voltage to the column of MOSFETS bridged across the integrating capacitors during the recharge of the integrating capacitors. Similar transistors are connected to each of the other columns.

Transistor M11-1 and capacitor C11 form the basic integrating element associated with the radiation detector in column 1, row 1. Transistor M11-2 and M11-3, which are connected to the integrator, act as a source follower driver and switch respectively and are used in connection with the readout of the output of the integrator. As can be seen in FIG. 4, sets of three transistors and one capacitor, similar to transistors M11-1 through M11-3 and capacitor C11, are repeated in the circuitry of the frame integrator for each radiation detector. (E.g. the transistors and capacitor which comprise the integrator and switches associated with the detection element located in row 4 and column 9 would be denoted transistors M59-1 through M59-3 and capacitor C59.)

Transistors MR1-1 through MR1-5 act as switches to control the voltages fed to the first row of integrators. Transistors MR2-1 through MR2-3 perform a similar function for row 2 and so on. Transistors MC1-11 and MC1-12 act as source follower load and switch respectively to read out the output of the integrators in column 1. Transistors MC2-11 and MC2-12 perform a similar function for the output of the second column of integrators and so on.

Figure 5:
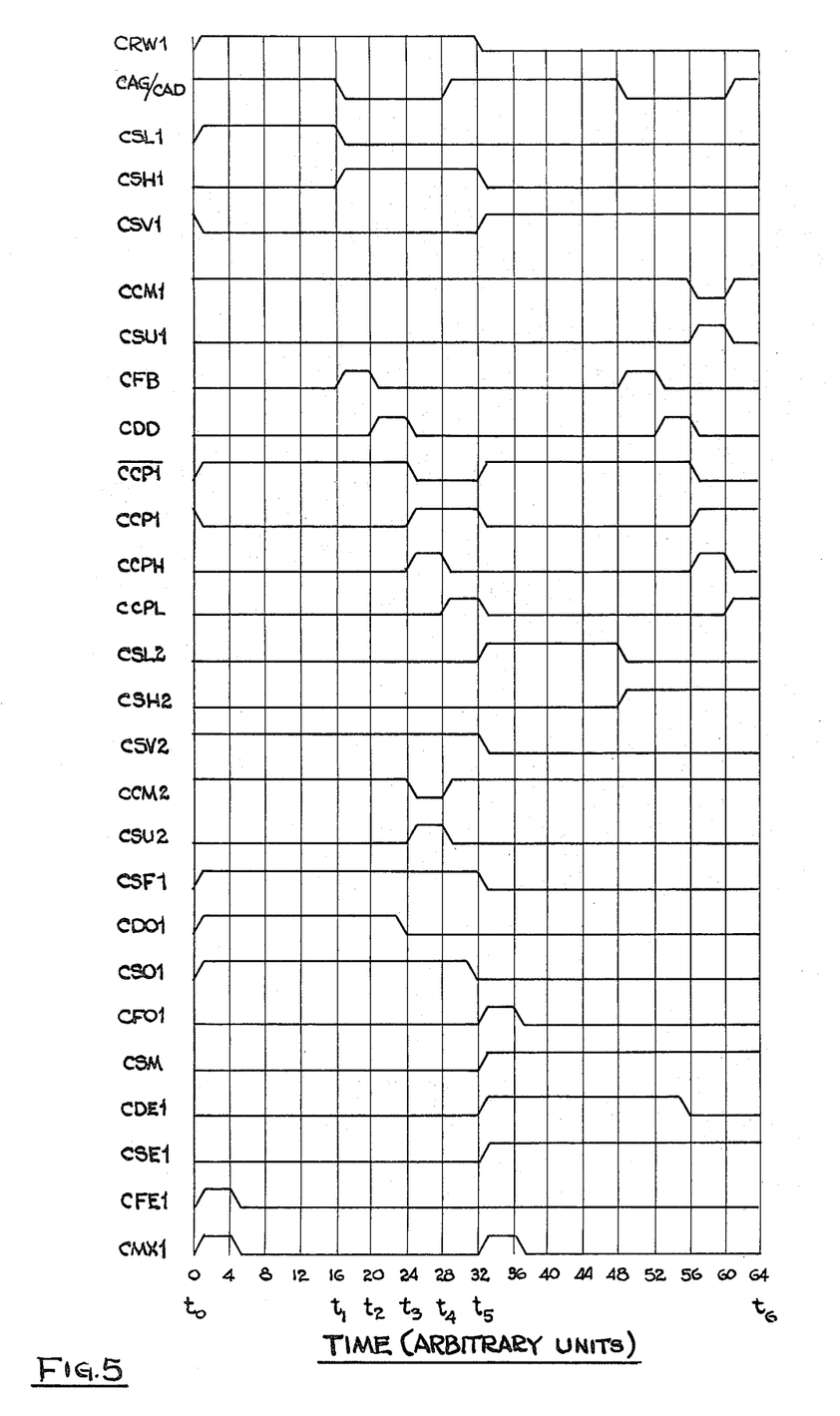
FIG. 5 is a timing diagram which shows the manner in which voltages applied to the frame integrator circuit vary with time.

An understanding of how the circuitry of the frame integrator operates can be obtained by referring to FIG. 4 and the timing diagram shown in FIG. 5. "n-channel" technology is described here, although the concept is also applicable to "p-channel" technology. All columns are processed in parallel; however, for simplicity, only the operation of column 1 is described. At $t_0$, the column line has been charged to the metal-insulator-semiconductor (MIS) detector deep depletion voltage and then floated. The preamplifier (MC1-3, MC1-4, MC1-5, MC1-6, MC1-7 and MC1-8) consisting of two linear amplifier stages followed by a source follower is energized when switch M-3 closes (CAD high) and the gate voltages of the amplifier loads go high (CAG high). The voltage CRW1 on the row-1 line of the detector array is raised to the flat-band voltage and the charge collected under the row-1 electrodes is transferred to the adjacent column electrodes. The resulting voltage change on column 1 is amplified and applied through switch MC1-10 ($\overline{CCP1}$ high) to the gate of M11-1. At the same time, the source voltage of M11-1 is lowered from VSV to VSL when switch MR1-1 opens (CSV1 low) and switch MR1-3 closes (CSL1 high). VSL is set to a value approximately equal to the voltages on the gate of M11-1 that results when the floated column voltage (prior to charge transfer) appears at the input to the preamplifier, but reduced by the amount of the threshold voltage of M11-1.

The increase in column voltage that occurs when row-to-column charge transfer takes place causes the M11-1 gate voltage to increase and current to flow through the MOSFET. The capacitor C11 is allowed to discharge until $t_1$ at which time switch MR1-3 opens (CSL1 low), switch MR1-2 closes (CHS1 high), and M11-1 turns off as a result of M11-1's source rising to VSH.

The charge transferred to the column electrodes is dumped into the substrate at $t_1$ by closing switch MC1-1 (CFB high) and thereby connecting the column line to the flat-band voltage VFB for a short period of time. (The "flatband voltage" is the voltage at which "band-bending" in semiconductor does not exist, i.e., bands are "flat", and charge density is zero throughout the metal-insulator-semiconductor structure.) At $t_2$, the column is charged to the deep depletion voltage, VDD, when switch MC1-2 closes (CDD high). The column is floated at $t_3$ when MC1-2 opens (CDD low) and the process described above is performed for row 2 during the next cycle beginning at $t_5$. During subsequent cycles, the process is repeated for row-3, row-4, . . . , row-128 in sequence, returning to row-1 after sequencing through all other rows.

The timing diagram shown in FIG. 5 assumes that the cycle from $t_0$ to $t_5$ is the last of the cycles to be integrated for the row-1, column-1 detector. During this cycle, it is necessary to first read out the voltage on C11 to a sample-and-hold circuit via the source follower consisting of M11-2 and MC1-11 and then to recharge C11 to its starting value at the beginning of an integration period. The process of recharging the integrating capacitor to its starting value is referred to herein as "resetting the integrator to zero". The recharging process will be described first.

At $t_3$, the output of the preamplifier is disconnected from M11-1 when switch MC1-10 opens ($\overline{CCP1}$ low). At the same time the voltage VCPH is applied to the gate of M11-1 when switch M-1 and switch MC1-9 close (CCPH and CCP1 high). C11 charges up to VSH during the period from $t_3$ to $t_4$ (CSH1 high). All other capacitors neither charge nor discharge because the lower terminals of the MOSFETS MX1-1 and the capacitor CX1 are raised to the voltage VSV which keeps the MOSFETS cut off. At $t_4$, switch M-1 opens (CCPH low) and switch M-2 closes (CCPL high) with the result that the M11-1 gate line is brought down in voltage to VCPL. The voltage VCPL is made approximately the same as the output of the preamplifier (i.e., the drain of MC1-8) when the input is the column conductor which is "floating" prior to charge transfer. Thus, the preamplifier source follower is not subjected to a violent voltage change when switch MC1-9 opens (CCP1 low) and switch MCL-10 closes ($\overline{CCP1}$ high) at $t_5$.

Also at $t_5$, switch MR1-2 opens (CSH1 low) and switch MR1-1 closes (CSV1 high) which causes the voltage VSV to be applied to the M11-1 source. VSV is set high enough to assure that M11-1 remains cut off when VCPH is applied to the gate through M-1 and MC1-9 during cycles involving other rows.

At $t_5$, a new cycle begins in which the pattern of operations from $t_0$ to $t_5$ is repeated but with second row cells substituted for first row cells. The method of individually interconnecting each element in a row of detectors with its corresponding integrator in a row of integrators by means of a time sequenced operation of switches (FET's) connected to column conductors is referred to here as the "row and column technique".

Figure 6:
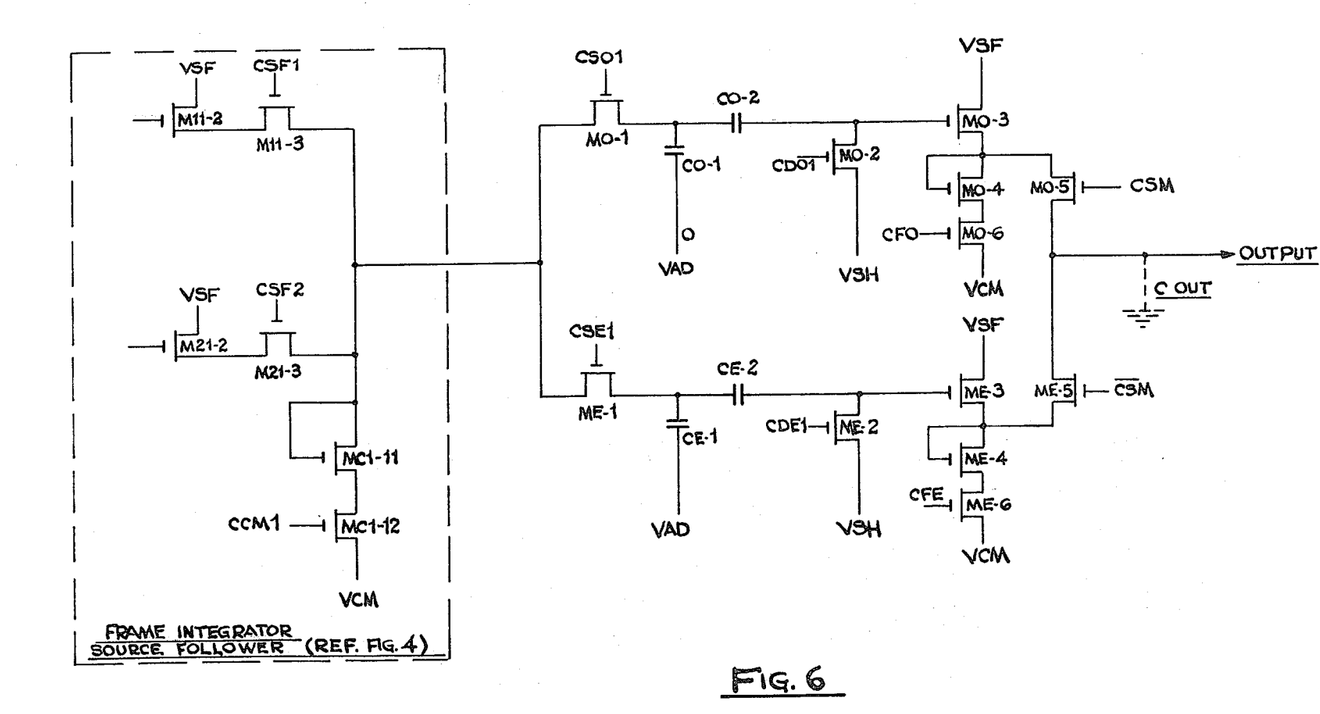
FIG. 6 is a schematic diagram of the sample and hold circuit which samples and holds the outputs at the integrators.

The read-out process is accomplished in conjunction with the sample-and-hold circuit shown in FIG. 6. Two sample-and-hold circuits are connected to the output of each column of integrators. When the cycle occurs for which readout of the integrating cell at the row 1, column 1 coordinate is desired (assumed to be the $t_0$–$t_5$ cycle in FIG. 5), then switches M11-2 and MC1-12 are closed (CF1 and CCM1 high).

At $t_0$, switches MO-1 and MO-2 close (CS01 and CDO1 high). Capacitors CO-1 and CO-2 both charge up to a voltage determined by the voltage on C11 in FIG. 4. Switch MO-2 opens just prior to $t_3$ (CDO low) with the result that the scaled final voltage on C11, after the series of discharge cycles that comprise the square-law integrating process, is stored on CO-2. By $t_4$, C11 is recharged to its original value and a voltage determined by the recharged value appears on CO-1. Switch MO-1 opens just prior to $t_5$ (CSO low) thereby isolating the sample-and-hold circuit from the frame integrator.

At $t_4$, the source follower consisting of MO-3 and MO-4 is energized by switch MO-6 closing (CFO1 high) and a voltage determined by the change in the C11 voltage during the integrating period appears at the output at $t_5$ when switch MO-5 closes (CSM high).

During the next cycle (beginning at $t_5$) the change in voltage of C21 is measured by the lower sample-and-hold circuit in FIG. 6 and supplied at the end of the cycle to the output through switch ME-5.

Figure 7:
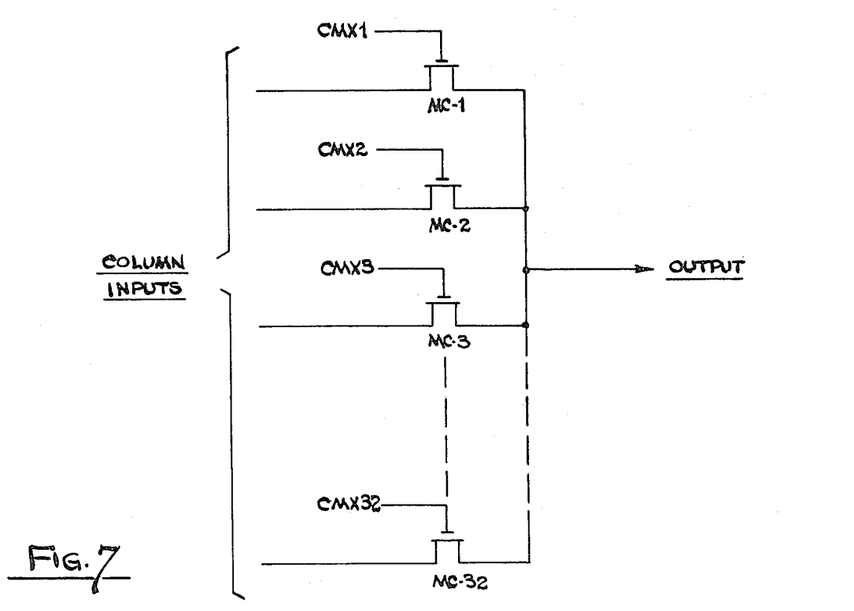
FIG. 7 is a circuit diagram of the multiplexer which multiplexes the outputs of the sample and hold circuits.

Each column output of the frame integrator feeds a pair of sample-and-hold circuits which in turn provides one of the inputs to the multiplexer shown in FIG. 7. The output of the column 1 pair of sample-and-hold circuits feeds the input line connected to MC1 in FIG. 7. The input is connected to the output when switch MC-1 is closed (CMX1 high, CCE high). The CMX1 control signal goes high when either CFO1 or CFE1 goes high (see FIG. 5). The sample-and-hold/multiplexer device is connected to a single A/D convertor. The output of the single analog-to-digital convertor is connected to an appropriate digital computation device which computationally compensates the sequence of digital outputs to compensate for "squaring" process in the integrators and for the variations in sensitivity and threshold between the various radiation detectors in the array. Means for performing such compensation are known in the art, see e.g. U.S. Pat. No. 3,800,078.

I claim:

1. A device for improving the sensitivity of an element of a two-dimensional array of radiation detectors comprising:
    (a) sampling and dumping means for sampling the output of the element and dumping the accumulated charge from the element after each sampling of the output, which means uses the charge injection device technique,
    (b) integrating means, responsive to the sampled output of the element, for integrating the sampled outputs,
    (c) readout means for periodically reading out the output of the integrating means and resetting the output of the integrating means to "zero".

2. A device for improving the sensitivity of each element of a two-dimensional array of radiation detectors comprising:
    (a) row and column means for individually sampling the output of each radiation detector and individually dumping the accumulated charge from each radiation detector after each sampling, which means uses the charge injection device technique,
    (b) a two-dimensional array of integrators having the same number of rows and columns as the array of radiation detectors, each integrator being responsive to the sequence of sampled outputs from its respective radiation detector,
    (c) row and column interconnection means for transferring, by row and column techniques, the sampled output of each radiation detector to its respective integrator,
    (d) readout means for periodically reading out, by row and column techniques, and resetting to "zero", by row and column techniques, the output of each of the integrators.

3. The device defined in claim 2 wherein each integrator comprises a MOSFET having a sink, a source, and a gate, and a capacitor, the capacitor being connected between the source and the sink of the MOSFET,
    and wherein the row and column interconnection means includes the connection of the source of each MOSFET to its associated row voltage source, and the gate of each MOSFET is connected to its associated column conductor, the sampled output of the respective detector being transferred to the MOSFET via the column connection to the gate of the MOSFET.

* * * * *